(12) United States Patent
Vaughan

(10) Patent No.: US 6,778,571 B2
(45) Date of Patent: Aug. 17, 2004

(54) LASER DRIVER CIRCUIT

(75) Inventor: Barry John Vaughan, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/230,980

(22) Filed: Aug. 30, 2002

(65) Prior Publication Data

US 2003/0043869 A1 Mar. 6, 2003

(30) Foreign Application Priority Data

Sep. 3, 2001 (EP) .......................................... 01307477

(51) Int. Cl.[7] ................................................ H01S 3/00
(52) U.S. Cl. ................ 372/38.1; 372/38.02; 372/38.04; 372/38.07
(58) Field of Search ............................ 372/38.1, 38.02, 372/38.05, 38.04, 38.07

(56) References Cited

U.S. PATENT DOCUMENTS

| | | | | |
|---|---|---|---|---|
| 4,243,951 A | * | 1/1981 | Wolkstein et al. | 372/38.02 |
| 5,883,910 A | * | 3/1999 | Link | 372/38.07 |
| 2001/0046243 A1 | * | 11/2001 | Schie | 372/38.02 |
| 2002/0118716 A1 | * | 8/2002 | Furudate et al. | 372/38.02 |
| 2003/0002551 A1 | * | 1/2003 | Kwon et al. | 372/38.02 |
| 2003/0086455 A1 | * | 5/2003 | Clubotaru et al. | 372/38.02 |

FOREIGN PATENT DOCUMENTS

| EP | 0 756 362 A1 | 1/1997 |
|---|---|---|
| EP | 1 063 774 A1 | 12/2000 |
| JP | 56 024991 | 10/1981 |
| JP | 2000-183448 | 6/2000 |

* cited by examiner

Primary Examiner—Don Wong
Assistant Examiner—James Menefee

(57) ABSTRACT

A laser driver circuit includes a pair of transistors having base electrodes respectively coupled to a differential input signal. The respective collector electrodes are coupled to a first power supply rail and the respective emitter electrodes are coupled to a laser diode via respective impedances and to respective controllable current sources to provide an average modulation voltage at the more positive of the emitter electrodes. By having the transistors in an emitter follower configuration, rather than the usual collector open collector configuration, the problem of mismatch between the output impedance of the transistors and the input impedance of the laser diode is reduced.

27 Claims, 4 Drawing Sheets

LASER DRIVER CIRCUIT

FIELD OF THE INVENTION

The present invention relates, in general, to a driver circuit for a laser, for example a laser diode. The invention is particularly, but not exclusively, concerned with matching a load impedance (that of the laser diode) to a source impedance (that of the laser driver) for maximum power transfer through the system.

BACKGROUND ART

It is well known that when a laser driver circuit is used to drive a laser diode many problems can occur due to mismatches between the source and the load as a result of the large difference in impedance between the two. The large mismatch in impedance between the source and the load arises because state-of-the-art laser driver circuits use an open collector circuit configuration, in which a collector of a transistor used in the driver circuit is coupled, directly or indirectly via, for example, an impedance, to the laser diode. Typically, for example, a collector of an NPN transistor would have an output impedance in the order of 1 k$\Omega$ in parallel with 500 fF, whereas the laser diode typically has an input impedance of only a few ohms (for example 5 $\Omega$ in parallel with 2 pF). Such a mismatch causes a proportion of the power to be reflected back from the laser diode, instead of being transmitted by the laser diode as laser light.

The present invention therefore seeks to provide a new and improved laser driver circuit having a relatively high efficiency.

Another object of the invention is to provide a new and improved laser driver circuit having a transistor driver for a laser, wherein a substantial impedance match is provided between a transistor driver and a laser diode load.

SUMMARY OF THE INVENTION

Accordingly, in a first aspect, the invention provides a laser driver circuit comprising a transistor having emitter, collector and base electrodes, the base electrode being coupled to an input terminal for receiving an input signal, the collector electrode being coupled to a first power supply rail and the emitter electrode being coupled to an output terminal for coupling to a laser.

In a preferred embodiment, the laser driver circuit comprises two transistors, each having emitter, collector and base electrodes, the respective base electrodes being coupled to respective differential input terminals for receiving a differential input signal, the respective collector electrodes being coupled to a first power supply rail and the respective emitter electrodes being coupled to a pair of respective differential output terminals for coupling to a pair of respective input terminals of a laser.

Preferably, each emitter electrode is coupled to the respective output terminal via a respective impedance. Each emitter electrode is preferably coupled to a respective current source, each current source preferably being controllable. Each current source is preferably coupled to a second power supply rail. One of the impedances is preferably coupled to either the first or the second power supply rail.

In one preferred embodiment, each emitter electrode is coupled to the respective output terminal via a respective capacitance coupled in series with the respective impedance. Preferably, each capacitance is coupled to the respective first or second power supply rail via an inductance. One of the inductances is preferably coupled to its respective power supply rail via a current source, which is preferably controllable.

In a second aspect, the invention provides a method of driving a laser using the laser driver circuit described above.

BRIEF DESCRIPTION OF THE DRAWING

Several embodiments of the invention will now be described, by way of example only, with reference to the accompanying drawings of which.

DETAILED DESCRIPTION OF THE DRAWING

Figure 1:
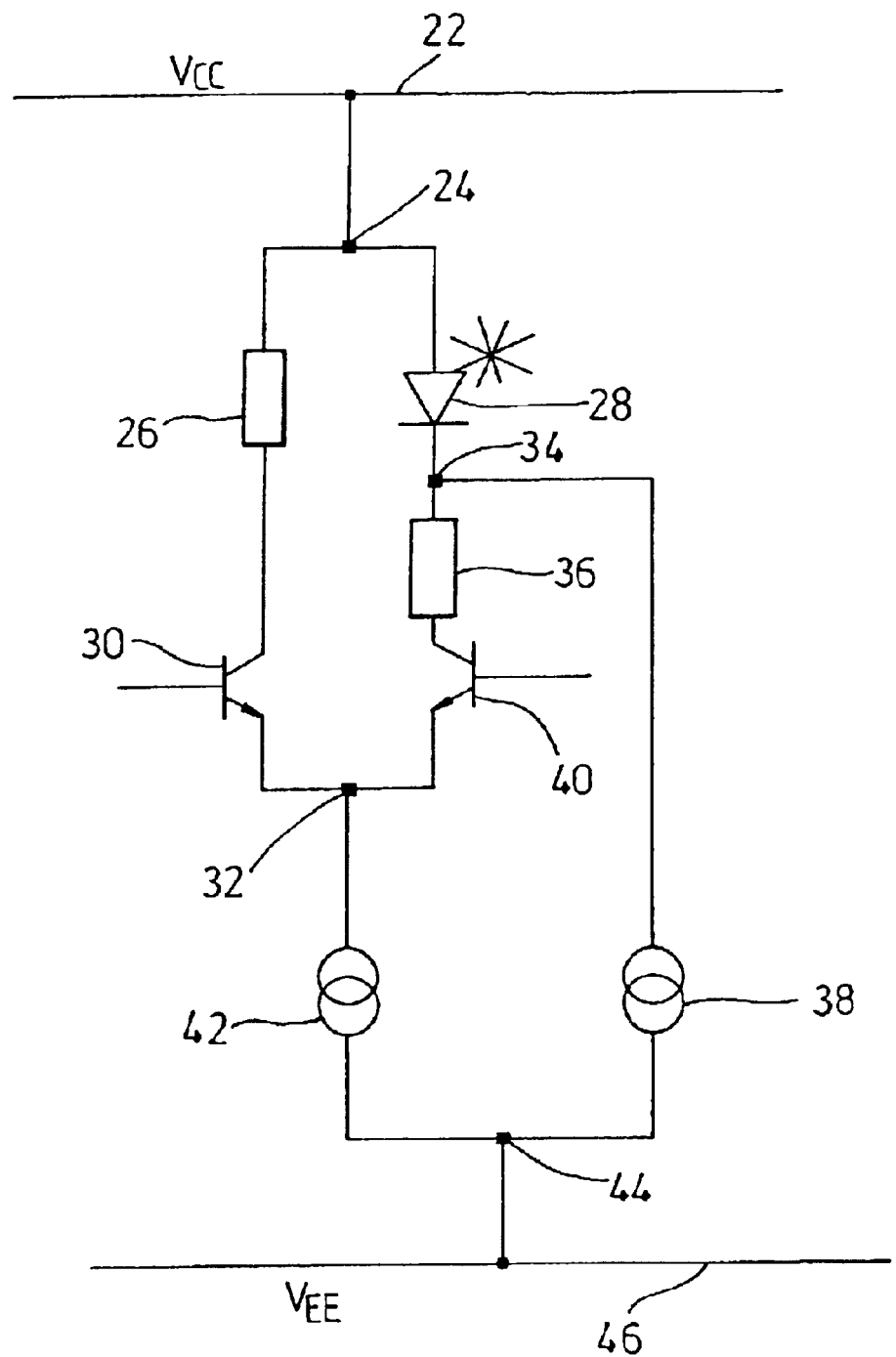
FIG. 1 is a schematic diagram of a known laser driver circuit having an open collector configuration.

Thus, FIG. 1 is a schematic diagram of a known laser driver circuit having an open collector configuration of a type used to, drive a laser diode. As shown in FIG. 1, a first voltage supply rail 22 is DC coupled to a first node 24, the first node 24 being DC coupled to a first terminal of a first impedance device 26, in the form of a resistor. A second terminal of the first impedance device 26 is DC coupled to a collector terminal of a first bipolar NPN transistor 30, the first transistor 30 having a base terminal and an emitter terminal. The node 24 is also DC coupled to an anode of a semiconductor laser diode 28, the laser diode 28 having a cathode DC coupled to a first terminal of a second impedance device 36 via a second node 34. The second terminal of the second impedance device 36 is DC coupled to a second bipolar NPN transistor 40, the second transistor 40 having a base terminal and an emitter terminal.

The emitter terminal of the first transistor 30 is DC coupled to the emitter terminal of the second transistor 40 via a third node 32 and both emitter terminals are coupled via the third node 32 to a first terminal of a first current source 42 which has a second terminal DC coupled to a second voltage supply rail 46 via a fourth node 44.

The third node 34 is DC coupled to a first terminal of a second current source 38, which has a second terminal DC coupled to the second voltage supply rail 46 via the fourth node 44.

In operation (of the embodiment of FIG. 1), the first voltage supply rail 22 provides a voltage $V_{CC}$ and the second voltage supply rail 46 provides a voltage $V_{EE}$, where $V_{CC} > V_{EE}$. The second DC current source 38 provides a threshold current for the laser diode 28 while a modulation current is provided for the laser diode 28 by the first DC current source 42. The first and second transistors 30, 40 are used to modulate the signal of the laser diode 28. The first and second transistors 30, 40 have a high output impedance at the collector terminals where the output impedance value may be, for example, 1 k$\Omega$. In contrast, the laser diode 28 has a low input impedance of the order of 5 $\Omega$. Consequently, there exists a large impedance mismatch between the source (transistors 30, 40) and the load (the laser diode 28). The known laser driver circuit of FIG. 1 uses the second impedance device 36 to match the source impedance to the load impedance using either lossy resistive matching or complex impedance matching. Lossy resistive matching dissipates energy and therefore costs power and is impractical at lower supply voltages, whereas complex impedance matching requires detailed knowledge of the circuit characteristics, is difficult to implement and is effective for a narrow working frequency band only.

Figure 2:
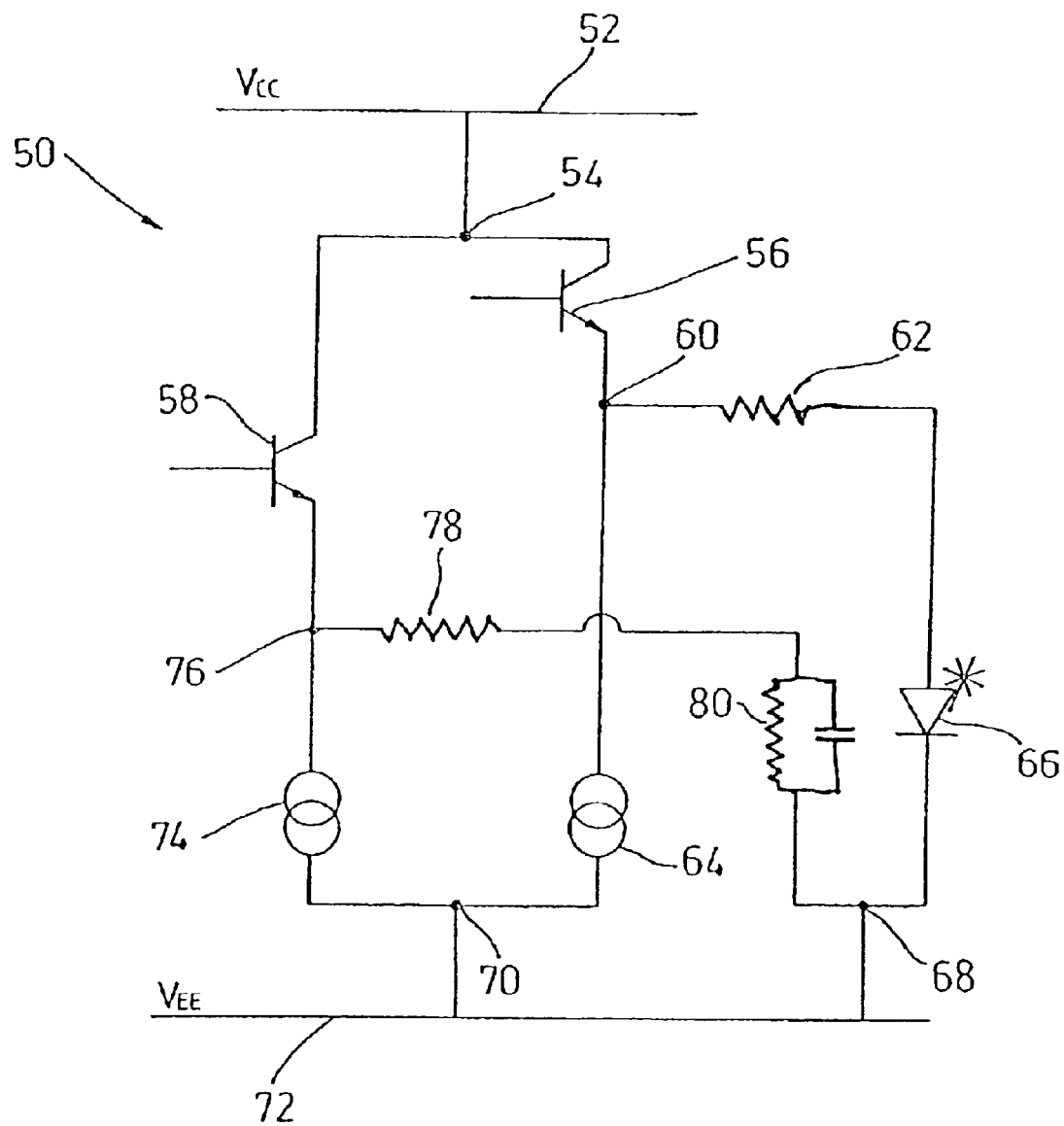
FIG. 2 is a schematic diagram of a first embodiment of the invention.

Referring to FIG. 2, a first embodiment of a laser driver circuit according to the present invention includes driver circuit 50 in an emitter follower configuration. A first voltage supply rail 52 is DC coupled to a first node 54 which is DC coupled to a collector terminal of a first bipolar NPN transistor 58, the first transistor 58 having a base terminal and an emitter terminal. The emitter terminal of the first transistor 58 is DC coupled to a first terminal of a first DC current source 74 via a second node 76, a second terminal of the first current source 74 being DC coupled to a second voltage supply rail 72 via a third node 70.

The first node 54 is also DC coupled to a collector terminal of a second bipolar NPN transistor 56, the second transistor 56 also having a base terminal and an emitter terminal. The emitter terminal of the second transistor 56 is DC coupled to a first terminal of a second DC current source 64 via a fourth node 60, the second terminal of the second current source 64 being DC coupled to the second voltage supply rail 72 via the third node 70.

The fourth node 60 is also DC coupled to a first terminal of a first impedance device 62, typically a resistor, which has a second terminal DC coupled to an anode terminal of a laser device 66. The laser device 66 has a cathode terminal DC coupled to a first terminal of a second impedance device 80, typically a resistor connected in parallel with a capacitor, via a fifth node 68 which has a second terminal DC coupled to the first terminal of a third impedance device 78, typically a resistor, which has a second terminal DC coupled to the second node 76. The fifth node 68 is DC coupled to the voltage supply rail 72.

In operation (of the embodiment of FIG. 2), the first voltage supply rail 52 provides a voltage $V_{CC}$ and the second voltage supply rail 72 provides a voltage $V_{EE}$, where $V_{CC}>V_{EE}$. The circuit 50 facilitates DC coupling between a driver including first and second transistors 58 and 56 and the laser load device 66. Average output power of the laser device 66 is set by the average voltage at the node 60, which is set by the base voltage of transistor 56. A constant current flows from node 60 through the first impedance device 62 and the laser device 66 to fifth node 68.

The first and second transistors 58, 56 are used to modulate the signal of the semiconductor laser diode 66. The first and second transistors 58, 56 have a low output impedance due to their arrangement in the emitter follower configuration, of about 1 Ω which closely matches the 5 Ω input impedance of the laser device 66. It is a straightforward matter therefore to use impedance devices 62, 78, 80 to match the load impedance to the source impedance. Typically, the impedance devices 62 and 78 are resistors having identical values of about 4–5 Ω while the impedance device 80 is chosen to have an impedance value substantially equal to the AC impedance of the laser device 66. Therefore, the sum of the AC currents at node 68 is substantially zero so that there will be little or no AC currents leaking to the second voltage supply rail 72 thus, reducing electromagnetic interference (EMI) problems.

Figure 3:
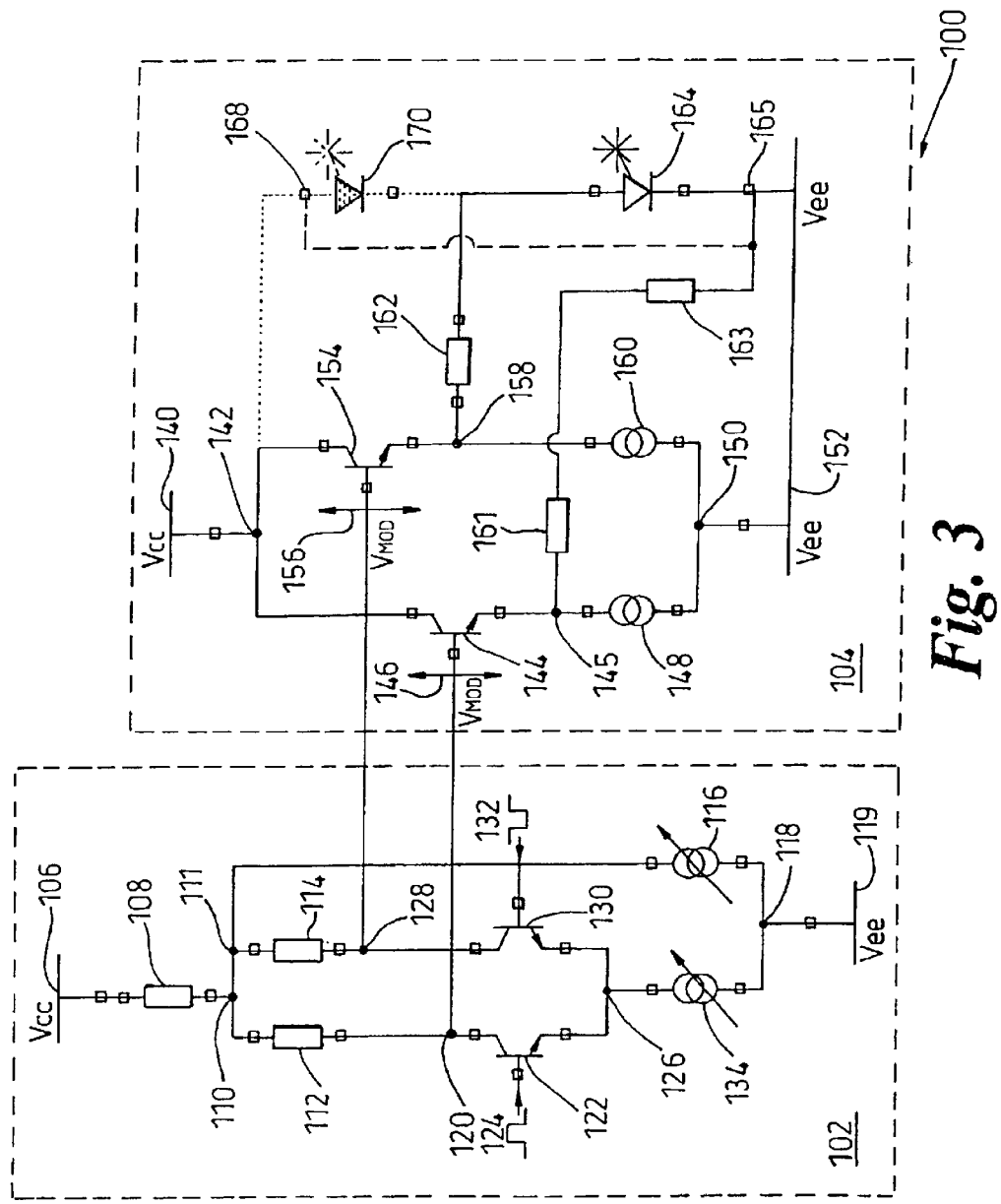
FIG. 3 is a schematic diagram of a second embodiment of the invention.

Referring to FIG. 3, a second embodiment of the present invention provides a circuit 100 having an input section 102 and a laser driving section 104 containing a load (a semiconductor laser device 164).

The input section 102 has a first voltage supply rail 106 DC coupled to a first terminal of a first impedance device 108, typically a resistor, the first impedance device 108 having a second terminal DC coupled to a first node 110. The first node 110 is DC coupled to a first terminal of a second impedance device 112, typically a resistor, which has a second terminal DC coupled to a collector terminal of a first bipolar NPN transistor 122, via a second node 120, the first transistor having a base terminal and an emitter terminal.

The first node 110 is also DC coupled via a fifth node 111 to a first terminal of a third impedance device 114, typically a resistor, which has a second terminal DC coupled, via a third node 128, to a collector terminal of a second bipolar NPN transistor 130, the second transistor 130 having a base terminal and an emitter terminal. The emitter terminal of the first transistor 122 is DC coupled to the emitter terminal of the second transistor 130 via a fourth node 126 and both emitter terminals are DC coupled via the fourth node 126 to a first terminal of a first variable DC current source 134 which has a second terminal DC coupled via a sixth node 118 to a second terminal of a second variable DC current source 116, the second current source 116 having a first terminal DC coupled to the fifth node 111. The sixth node 118 is DC coupled to a second voltage supply rail 119.

The laser driving section 104 is substantially identical to the laser driver circuit 50 of FIG. 2, and contains a third voltage supply rail 140 DC coupled via a seventh node 142 to a collector terminal of a third bipolar NPN transistor 144 and a collector terminal of a fourth bipolar NPN transistor 154, both transistors 144 and 154 being arranged to have emitter collector paths in parallel to each other, across rails 140 and 152.

A base terminal of the third transistor 144 is DC coupled to the second node 120, an emitter terminal of the third transistor 146 is DC coupled via an eighth node 145 to a first terminal of a third current source 148, the second terminal of which is DC coupled via a ninth node 150 to a fourth voltage supply rail 152.

A base terminal of the fourth transistor 154 is DC coupled to the third node 128, an emitter terminal of the fourth transistor 154 is DC coupled via a tenth node 158 to a first terminal of a fourth current source 160, the second terminal of which is DC coupled to the ninth node 150.

The eighth node 145 is DC coupled to a first terminal of a fourth impedance device 161, typically a resistor, which has a second terminal coupled to a first terminal of a fifth impedance device 163, typically a resistor in parallel with a capacitor, which has a second terminal DC coupled via an eleventh node 165 to the fourth voltage supply rail 152.

The tenth node 158 is coupled to a first terminal of a sixth impedance device 162, typically a resistor, which has a second terminal DC coupled to an anode of a semiconductor laser device 164, the cathode of which is DC coupled via the eleventh node 165 to the fourth voltage supply rail 152.

In operation (of the embodiment of FIG. 3), the input section 102 is used to modulate the input voltage to the laser driving section 104, with the first and third voltage supply rails 106, 140 providing a voltage $V_{CC}$ while the second and fourth voltage supply rails 119 and 152 provide a voltage $V_{EE}$, where $V_{CC}>V_{EE}$. A non-inverted data signal 124 including substantial AC components is applied to the base of the first transistor 122 and an inverted data signal 132 including the same substantial AC components is applied to the base of the second transistor 130. Signals 124 and 132 are complementary so that signal 132 is an inverted replica of signal 124. The laser modulation current is proportional to the current provided by the variable DC current source 134 while the variable DC current source 116 is part of a controller for the average output power of laser 164. Source 116, in combination with resistor 108, together set the mean, i.e., average output power of the laser device 164. Since second and third impedance devices 112, 114 are preferably fixed value resistors, in this embodiment variable DC voltages having values dependent on the values of the output current of source 116 and resistors 108, 112 and 114 are derived at the second node 120 and the third node 128. The DC voltages at nodes 120 and 128 are modulated by the complementary voltages of signals 124 and 132. The input section 102 therefore provides a first modulated input voltage 146 to the base of the third transistor 144 and a second modulated input voltage 156 to the base of the fourth transistor 154.

The laser driving section 104 operates in an equivalent way to that of the laser driver circuit described with reference to FIG. 2, the first embodiment of the invention.

In an alternative embodiment of the circuit 100 the laser device 164 is connected as shown at position 170 and coupled to the output stage 104 as illustrated by the dotted line. In particular, the fourth and fifth impedance devices 161, 163 are not connected to the eleventh node 165 but are instead DC coupled to a twelfth node 168 which is DC coupled to the anode of laser diode 170, the cathode of which is tied to node 165, i.e., a short circuit exists where the laser diode 164 is illustrated in FIG. 3. In the alternative embodiment of the circuit 100 the signal polarity is reversed. Increases in the first variable current source 134 still increase the modulation current but reducing the second variable current source 116 reduces the bias current at node 128.

Figure 4:
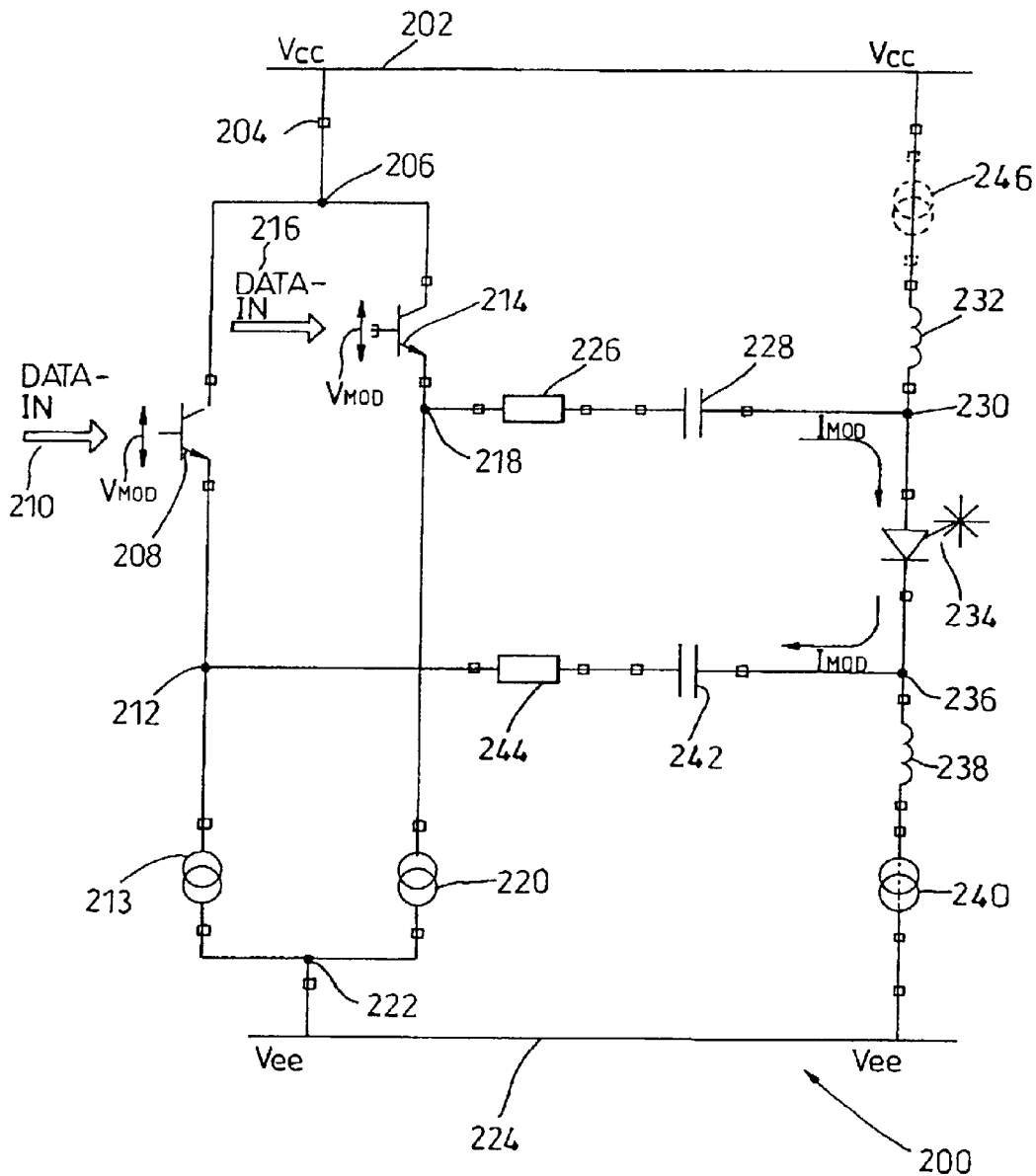
FIG. 4 is a schematic diagram of a third embodiment of the invention.

Referring to FIG. 4, a third embodiment of the present invention provides a circuit 200 having a first voltage supply rail 202 DC coupled via a first node 206 to a collector terminal of a first bipolar NPN transistor 208 and a collector terminal of a second bipolar NPN transistor 214.

The first transistor 208 has a base terminal and an emitter terminal, the, emitter terminal being DC coupled via a second node 212 to a first terminal of a first DC current source 213, which has a second terminal DC coupled via a third node 222 to a second voltage supply rail 224. The second transistor 214 has a base terminal and an emitter terminal, the emitter terminal being DC coupled via a fourth node 218 to a first terminal of a second current source 220, which has a second terminal DC coupled to the third node 222.

The first voltage supply rail 202 is also DC coupled to a first terminal of a first inductor 232 which has a second terminal DC coupled in series via a fifth node 230 to an anode terminal of a semiconductor laser device 234. A cathode terminal of the laser device 234 is DC coupled in series via a sixth node 236 to a first terminal of a second inductor 238 which has a second terminal DC coupled to a first terminal of a third DC current source 240 the second terminal of which is DC coupled to the voltage supply rail 224. The first and second DC current sources 213, 220 are controllable in order to provide half of the modulation current for the laser device 234.

The fifth node 230 is AC coupled to the fourth node 218 via a first terminal of a first capacitor 228 which has a second terminal DC coupled to the first terminal of a first impedance device 226, the second terminal of which is DC coupled to the fourth node 218.

The sixth node 236 is AC coupled to the second node 212 via a first terminal of a second capacitor 242 which has a second terminal DC coupled to a first terminal of a second impedance device 244 which has a second terminal DC coupled to the second node 212.

In operation (of FIG. 4) a differential data signal formed by an inverted data signal 210 and a non-inverted data signal 216 is applied to the base of the first transistor 208 and the base of the second transistor 214. The data output from the transistors 208 and 214 is AC coupled by capacitors 228 and 242 to the laser diode 234. The bias current for laser diode 234 is provided separately from the current source 240 (or 246) and DC coupled to the laser diode 234 by means of the inductor 238 or the inductor 232 respectively. The mean voltages at nodes 212 and 218 do not influence the mean current through or power of the laser device 234 because capacitors 242 and 228 decouple the DC voltage at the nodes from laser diode 234. The laser mean output power is set by the third DC current source 240 (a controllable part of the mean power controller). The AC signal is blocked from leaking to the first or second voltage supply rails 202, 224 by the AC blocking elements, in the form of first and second inductors 232, 238.

As provided for in the embodiments of FIGS. 2 and 3, the embodiment of FIG. 4, the source includes driver 200 having a low output impedance due to the emitter follower arrangement which closely matches the AC output impedance of the driver between nodes 230 and 236 and the input impedance of laser diode load 234.

In an alternative embodiment to FIG. 4, the third current source 240 is removed and replaced by source 246 having a first terminal coupled to the first voltage supply rail 202 and a second terminal coupled to the first terminal of the first inductor 232.

While several particular embodiments of the invention have been described above, it will be appreciated that a person skilled in the art can make modifications and improvements without departing from the scope of the present invention.

What is claimed is:

1. A laser driver circuit, comprising:
two transistors, each having emitter, collector and base electrodes, the respective base electrodes being coupled to respective differential input terminals for receiving a differential input data signal, the respective collector electrodes being coupled to a first power supply rail and the respective emitter electrodes being coupled to a pair of respective differential output terminals for coupling to a pair of respective input terminals of a laser, each emitter electrode being coupled to the respective output terminal via a respective impedance, each emitter electrode further being coupled to a respective current source, each current source being controllable, each current source being coupled to a second power supply rail, each one of the impedances being coupled to the second power supply rail, each emitter electrode being coupled to the respective output terminal via a respective capacitance, each respective capacitance being coupled in series with a respective impedance, and each capacitance being coupled to a respective first or second power supply rail via an inductor.

2. A laser driver circuit according to claim 1, wherein one of the inductances is coupled to its respective power supply rail via a further current source.

3. A laser driver circuit according to claim 2, wherein the further current source is controllable.

4. A laser driver circuit according to claim 3, further comprising an input section having first and second input terminals for receiving a differential input signal, the first and second input terminals being respectively coupled to base electrodes of a differential pair of transistors having their emitter electrodes coupled together and to a current source and their collector electrodes coupled via respective impedances to the first power rail and, via a second current source to the second power supply rail, the respective collector electrodes of the differential pair of transistors being coupled to the respective differential input terminals.

5. A laser driver circuit according to claim 1, in combination with a laser coupled to the output terminals.

6. A laser driver circuit according to claim 5, wherein the laser is a laser diode.

7. A circuit adapted to be responsive to a data signal, the circuit comprising first and second DC power supply terminals, a transistor having first and second electrodes connected between the first and second DC power supply terminals, the transistor including a control electrode for controlling the current flowing between the first and second electrodes from the first and second DC power supply terminals, the first electrode being a lower impedance electrode than the second electrode, a semiconductor diode for emitting optical energy, signal driver circuitry for coupling only AC current between the diode and the first electrode, and DC biasing circuitry connected to the diode for supplying biasing current to the diode independently of DC current flowing in the transistor.

8. The circuit of claim 7 wherein the first and second electrodes are respectively electrodes for emitting and collecting current, the signal driver circuitry having one terminal connected to the first electrode and a second terminal connected to an electrode of the diode.

9. The circuit of claim 8 wherein the signal driver circuitry includes a capacitor connected in series between the first and second terminals of the signal driver circuitry.

10. The circuit of claim 9 wherein the impedances of the diode and circuitry driving the diode are substantially matched.

11. The circuit of claim 10 wherein the transistor is a bipolar transistor and the first and second electrodes are respectively the transistor emitter and collector and the control electrode is the transistor base.

12. The circuit of claim 9 wherein the DC biasing circuitry is connected between the first and second DC power supply terminals and includes an inductive impedance for decoupling the AC current flowing in the signal driver circuitry from the DC power supply terminals.

13. The circuit of claim 7 wherein the transistor is included as a first transistor in a differential amplifier including a second transistor connected between the DC power supply terminals; the control, first and second electrodes of the first transistor being respectively first control, first current emitting and first current collecting electrodes; the second transistor including second control, second current emitting and second current collecting electrodes; the second current emitting and second current collecting electrodes being connected between the DC power supply terminals so that the first and second current collecting electrodes are connected to the same DC power supply terminal; the signal driver circuit and the first and second current emitting electrodes being connected so that only AC drive current for the diode flows between the first and second current emitting electrodes via the diode.

14. The circuit of claim 13 wherein the DC driver circuit includes first and second capacitors, the first capacitor being connected in series between the first current emitting electrode and a first electrode of the diode, the second capacitor being connected in series between the second current emitting electrode and a second electrode of the diode.

15. The circuit of claim 14 wherein the impedances of the diode and circuitry driving the diode are substantially matched.

16. The circuit of claim 15 wherein the first and second transistors are bipolar transistors.

17. The circuit of claim 15 wherein the DC biasing circuitry is connected between the first and second DC power supply terminals and includes an inductive impedance for decoupling the AC current flowing in the signal driver circuitry from the DC power supply terminals.

18. The circuit of claim 17 wherein the inductive impedance includes first and second inductors, the first inductor being connected in series between the first power supply terminal and a first electrode of the diode, the second inductor being connected in series between the second power supply terminal and a second electrode of the diode.

19. The circuit of claim 18 wherein the diode is a laser.

20. The circuit of claim 15 further including first and second current sources, the first current source being DC connected between the first current emitting electrode and the first DC power supply terminal, the second current source being DC connected between the second current emitting electrode and the second DC power supply terminal.

21. The circuit of claim 13 wherein the DC biasing circuitry is connected between the first and second DC power supply terminals and includes an inductive impedance for decoupling the AC current flowing in the signal driver circuitry from the DC power supply terminals.

22. The circuit of claim 13 wherein the inductive impedance includes first and second inductors, the first inductor being connected in series between the first power supply terminal and a first electrode of the diode, the second inductor being connected in series between the second power supply terminal and a second electrode of the diode.

23. The circuit of claim 13 wherein the diode is a laser.

24. The circuit of claim 13 further including first and second current sources, the first current source being DC connected between the first current emitting electrode and the first DC power supply terminal, the second current source being DC connected between the second current emitting electrode and the second DC power supply terminal.

25. The circuit of claim 13 wherein the inductive impedance includes first and second inductors, the first inductor being connected in series between the first power supply terminal and a first electrode of the diode, the second inductor being connected in series between the second power supply terminal and a second electrode of the diode, and a current source connected between the first and second power supply terminals and in series with the first and second inductors and the diode.

26. The circuit of claim 7 wherein the DC biasing circuitry is connected between the first and second power supply terminals and includes a current source connected between the first and second power supply terminals and in series with the diode.

27. The circuit of claim 26 wherein the impedances of the diode and circuitry driving the diode are substantially matched.

* * * * *